ELECTRONIC DEVICE

Original Filed March 20, 1945

INVENTOR
George C. Sziklai
BY C. D. Tuska
ATTORNEY

Patented Dec. 4, 1951

2,577,164

UNITED STATES PATENT OFFICE 2,577,164

ELECTRONIC DEVICE

George C. Sziklai, Princeton, N. J., assignor to Radio Corporation of America, a corporation of Delaware Original application March 20, 1945, Serial No. 583,801. Divided and this application January 18, 1946, Serial No. 642,047

10 Claims. (Cl. 313—104)

Figure 3:
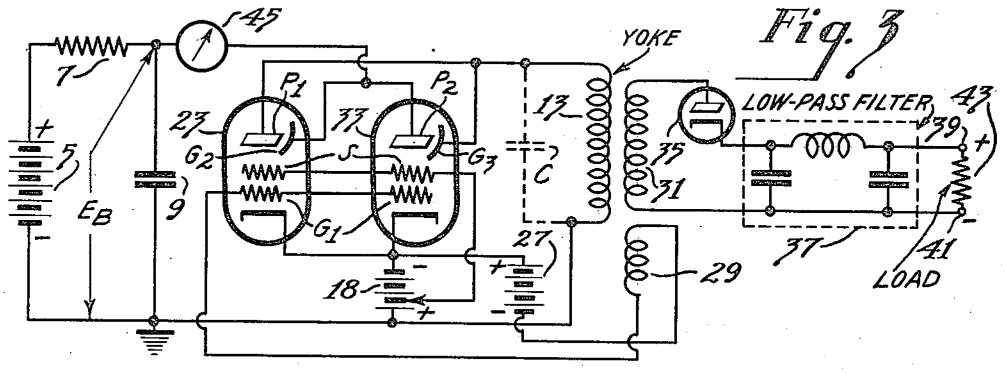

This application is a division of applicant's copending application Serial No. 583,801, filed March 20, 1945, upon which U. S. Patent 2,456,754 was granted December 21, 1948, entitled Electronic Device and assigned to the same assignee as the instant application.

This invention relates generally to electronic apparatus and more particularly to improved sawtooth pulse generators and electronic switching tube apparatus employed therewith.

The invention relates specifically to sawtooth pulse generating circuits utilizing novel nonpolarized low impedance electronic switches which are controllable by weak high frequency electrical keying signals. Such apparatus has particular applications to cathode ray oscillographic and television cathode ray deflection systems.

Conventional sawtooth pulse generators employing thermionic vacuum tubes require special wave damping circuits since the high resistance of the thermionic vacuum tubes employed as switching devices permit oscillatory currents to circulate throughout the circuit. Such oscillatory currents must be effectively suppressed to provide a substantially linear sawtooth output voltage waveform. Also such suppressor circuits and high resistance switching tubes dissipate considerable energy, thereby requiring the use of relatively high power apparatus for providing the required high voltage sawtooth deflecting pulses.

The instant invention employes novel bidirectional thermionic tubes of the orbital-beam type. Due to the relatively high operating efficiency inherent in such secondary emission tubes, the switching resistance is relatively low, and the bidirectional characteristics of the device eliminate the necessity for oscillatory current suppressor circuits. The measured efficiency of the instant system is of the order of 5 times that of other known systems, thereby permitting the use of apparatus having relatively low power ratings.

Among the objects of the invention are to provide an improved method of and means for generating sawtooth pulse electrical currents. Another object is to provide an improved sawtooth pulse generator employing a novel bidirectional electronic switch. An additional object is to provide a novel pulse generator employing a bidirectional orbital-beam electronic switching device. A further object of the invention is to provide a sawtooth pulse generator having high operating efficiency characteristics. Another object of the invention is to provide a continuously operating sawtooth generator utilizing a novel bidirectional electronic switch which eliminates the necessity for oscillatory current suppressor networks.

Other objects of the invention are to provide an improved high voltage unidirectional power source. Another object is to provide an improved deflection voltage generator for oscillographic apparatus. An additional object is to provide a novel bidirectional electronic switch. A further object is to provide a novel electronic bidirectional switch utilizing secondary electronic emission for obtaining high operating efficiency. A still further object is to provide an improved bidirectional electronic switch of orbital-beam type. Another object is to provide an improved bidirectional electronic switch of cycloidal beam type.

Figure 2:
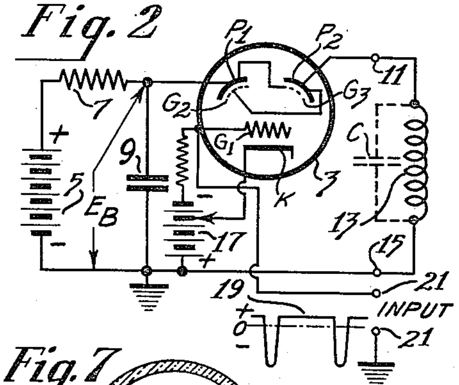
Figures 4, 5:
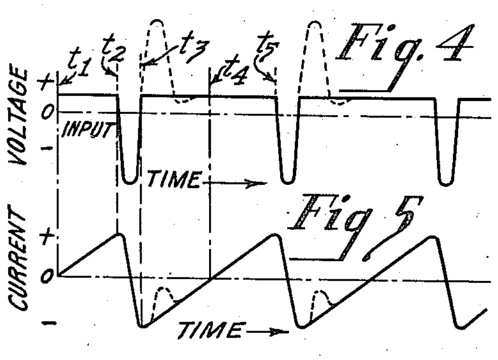
Figure 7:
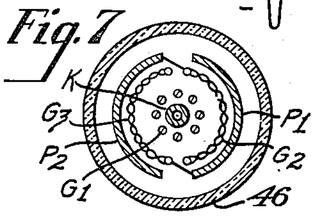
Figure 1:
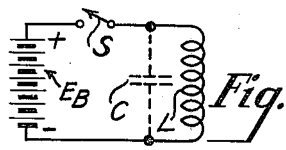
Figure 8:
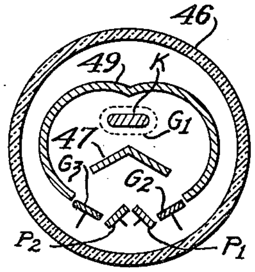
Figure 9:
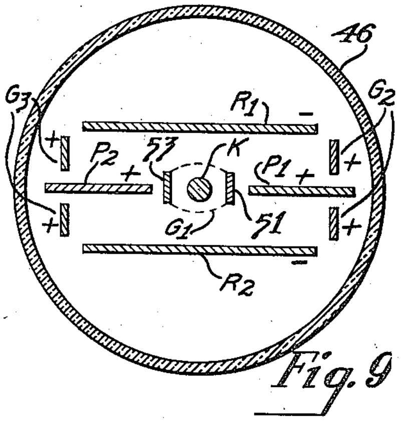
Figure 6:
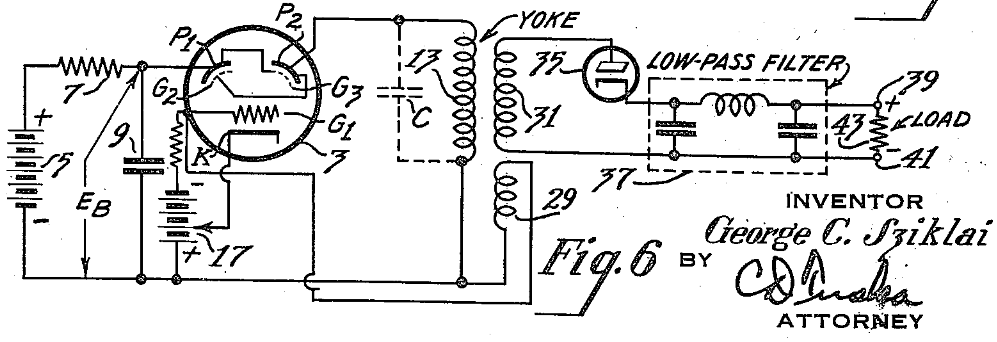

The invention will be described theoretically and with reference to specific circuits and structure by reference to the accompanying drawing of which Figure 1 is a schematic circuit diagram for explaining the basic theory of the system, Figure 2 is a schematic circuit diagram of a first embodiment of the invention adaptable, for example, to television kinescope deflection circuits, Figure 3 is a schematic circuit diagram of a second embodiment of the invention adapted to simultaneous operation for deflection of a television cathode ray beam and for supplying high unidirectional operating voltages for external circuits, Figure 4 is a graph illustrating voltage characteristics in the circuit, Figure 5 is a graph illustrating current characteristics in the circuit, Figure 6 is a schematic circuit diagram of a third embodiment of the invention having similar applications to the circuit of Figure 3 and employing a novel bidirectional electronic switch, Figure 7 is a cross-sectional plan view of a first novel type of bidirectional electronic switch, Figure 8 is a cross-sectional plan view of a second novel bidirectional electronic switch of orbital-beam type, and Figure 9 is a cross-sectional plan view of a third novel bidirectional switch of cycloidal beam type. Similar reference characters are applied to similar elements throughout the drawing.

Referring to the drawing, the circuit of Fig. 1 shows the basic circuit of many conventional types of sawtooth pulse generators. The battery $E_B$ represents a power source (which in more detailed circuits may comprise a charged storage capacitor), S represents an ideal bidirectional switch capable of high speed operation and designed to withstand high voltages in its open position and having perfect bidirectional conduction in its closed position; L represents an inductive load such, for example, as a deflecting yoke for a television kinescope tube, and C is the distributed capacitance of said yoke. The circuit may be assumed to include no resistance.

When the switch S is first closed at time $t_1$, the current (see Figure 5), will increase linearly with time:

$$\frac{di}{dt}=\frac{E_B}{L} \qquad (1)$$

until at time $t_2$ the switch is opened. Then the current stored in the inductance L will be discharged through the capacitance C in an oscillatory manner, the solution for the equilibrium equation being $$L\frac{di}{dt}+\frac{i}{C}\int idt=0 \qquad (2)$$

$$i=-\frac{E_B}{\sqrt{\frac{L}{C}}}\sin\frac{t}{\sqrt{LC}} \qquad (3)$$

If the switch is closed at time $t_3$ corresponding to the end of a half period of the self resonance of the inductor, the inductance returns its energy to the battery $E_B$ with the current changing linearly with time until the instant $t_4$, at which time current equilibrium occurs. Then the battery will deliver current in a linear manner to the inductance, and the cycle will be repeated.

It will be seen from the foregoing simple analysis that if there is no resistance in the circuit, and the switch system is perfectly bidirectional, no external energy would be required to provide a continuous sawtooth current (which would be wattless) and the purely reactive load would behave in the same manner as zero power factor loads behave with sinusoidal currents. This condition is true from the fact that deflection of a cathode ray electron beam, by periodic deflecting voltages or currents, requires no work, the reactance of the reflecting yoke acting merely as a fly-wheel for moving the cathode ray beam bidirectionally.

Figure 4 represents the voltage which would appear across the inductance L, $$\left(E_L=L\frac{di}{dt}\right) \qquad (4)$$

and it will be observed that the waveform of this voltage is substantially the derivative of the current waveform since the voltage is responsive to the rate of change of current through the inductance L. However, the voltage $E_L$ is much greater than the input voltage $E_B$, the value being $$E_L=1.41E_B\frac{t_5-t_3}{t_3-t_2} \qquad (5)$$

Since the yoke comprising the inductance necessarily includes resistance, the current into the inductance must satisfy the following:

$$iR+L\frac{di}{dt}=E_B \qquad (6)$$

or in the exponential form, $$i=\frac{E_B}{R}\left(1-\epsilon^{-\frac{R}{L}t}\right) \qquad (7)$$

wherein the sawtooth waveform is not linear.

However, resistance in the switch causes greater difficulty than resistance in the inductance load. With conventional grid-controlled electron tubes employed as electronic switches, the resistance is many times that of the resistance of the inductive yoke. Although impedance transformation may be employed between the electronic switch and the associated circuit, a transformation limit is encountered by the fact that the return time of the sawtooth wave is determined by the inductance and distributed capacity of the transformer ($t_3-t_2=\pi\sqrt{LC}$). Another difficulty is met by the fact that conventional electron tubes are not bidirectional and do not actually conduct until the yoke voltage is discharged to a value below the tube anode supply potential. In the interim, the yoke circuit retains its oscillatory characteristics, thereby providing yoke voltages which are distorted, as indicated by the dashed-line portions of the graph of Fig. 4. The yoke current also is distorted as indicated by the dashed-line portions of the graph of Fig. 5.

Some prior systems have employed diode or triode thermionic tubes connected across the inductive load in order to suppress such undesired oscillatory currents, the suppressor tubes operating as switching devices during the time interval when the thermionic switching tube is not conducting due to reversed potentials on its anode. The instant invention, by employing a truly bidirectional electronic switching device, eliminates the necessity for such oscillatory current suppressor circuits since it approximates the operating characteristics of a perfect bidirectional switch.

Referring to Fig. 2, a bidirectional electronic switch 3 comprises an evacuated envelope containing a thermionic cathode K, a control electrode $G_1$, a pair of secondary-electron-emissive anodes $P_1$ and $P_2$, and a pair of secondary-electron-collector electrodes $G_2$ and $G_3$, wherein collector electrode $G_2$ is responsive to secondary electrons from anode $P_1$, and collector electrode $G_3$ is responsive to secondary electrons from the anode $P_2$.

A voltage source such as, for example, a battery 5 is connected through a high resistor 7 to charge a storage capacitor 9, one terminal of which is grounded. The charge on the storage capacitor 9 is indicated as $E_B$. The ungrounded terminal of the storage capacitor 9 is connected to the first anode $P_1$ and to the second collector electrode $G_3$ of the bidirectional electronic switch 3. The first collector electrode $G_2$ and the second anode $P_2$ are connected to one terminal 11 of a reactive load 13 such as, for example, an inductive yoke for deflecting the beam of a cathode ray oscillograph tube. The remaining terminal 15 of the inductive load 13 is grounded. The distributed capacitance of the inductive load 13 is indicated by the capacitance C, shown in dash lines, connected through a suitable grid resistor in shunt with the inductive load. A bias battery 17 is connected between the control electrode $G_1$ and ground to provide fixed operating bias voltages for the control grid, cathode and the second anode. The cathode K is connected to an intermediate point on the bias battery 17. Input signals, having a waveform 19, are applied to the circuit through input terminals 21 connected between the control electrode $G_1$ and ground.

In operation the supply voltage $E_B$ charges the storage capacitor 9 and applies high potential to the first anode $P_1$ and to second collector electrode $G_3$. Positive potential from the bias battery 17 also is applied to the second anode $P_2$ and the first collector electrode $G_2$. The initial positive pulse portion of the input signal 19 at the time $t_1$ applied to the control electrode $G_1$, causes primary electrons to pass from the cathode K to both of the secondary-electron-emissive anodes $P_1$ and $P_2$, which each emit relatively large numbers of secondary electrons.

Since the first anode $P_1$ and the second collector electrode $G_3$ are more positive than the second anode $P_2$ and the first collector electrode $G_2$, the secondary electrons emitted from the second anode $P_2$ are collected by the second collector electrode $G_3$, and those emitted from the first anode $P_1$ are returned thereto. This establishes an effective electrical connection between the anodes $P_1$ and $P_2$ causing current to build up in the inductive load 13 according to the law $I=E/Lt$ (by assuming no losses in the circuit). This current continues to build up until the time $t_2$, when a relatively high negative pulse is applied to the control electrode $G_1$, thus interrupting the primary electrons passing from the cathodes to the anodes $P_1$ and $P_2$. Since no primary electrons reach the anodes, no secondary electrons are emitted therefrom, and the effective circuit between the anodes is opened.

Then the energy stored-up in the inductive load 13 will be discharged by its distributed capacitance C in an oscillatory fashion, as shown in the graph of Fig. 5, between the times $t_2$ and $t_3$. At the time $t_3$ the control electrode $G_1$ again becomes positive, and primary electrons from the cathode reach the anodes $P_1$ and $P_2$, and again produce secondary-electron-emission therefrom. At this time, the inductive load 13 discharges its energy through the effective connection between the anodes $P_1$ and $P_2$ to the storage capacitor 9, thus returning part of the energy to the power supply during the period between $t_3$ and $t_4$. At the time $t_4$, both anodes $P_1$ and $P_2$ are at the same potential. At this time, the sawtooth cycle commences to repeat, since the first anode $P_1$ becomes more positive than the second anode $P_2$.

Since the potential generated across the inductive load 13 is similar in waveform to that indicated in graph 19 (see Fig. 4), because $$E=L\frac{di}{dt}$$

the input control voltage applied to the input terminals 21 may be derived from a secondary winding coupled to the inductive load 13, as shown and described hereinafter by reference to the circuits of Figs. 3 and 6. Thus, the circuit may be used as a keyed generator or as a continuous generator, depending upon the source of control pulses applied to the control electrode $G_1$.

The bidirectional switching circuit thus described has low series impedance, bidirectional operating characteristics, and because of its high efficiency requires relatively low cathode emission. The secondary-electron-emissive anodes $P_1$ and $P_2$ may be coated with silver magnesium or other materials which emit secondary electrons of the order of 4 or more times the number of primary electrons impinging thereon. Such surfaces may be operated at high current densities for several thousand hours. Voltage source 5 should preferably be of the order of 200 volts in order to provide ample primary electron emission. Although the anode-to-anode impedance is measurable, the efficiency of the system will be at least 5 times that obtainable when using conventional thermionic switching tubes, since no energy dissipative oscillatory current suppressors are required, and the switch series impedance is substantially reduced.

The circuit of Fig. 3 is similar to the circuit of Fig. 2 except that two conventional orbital beam tubes 23 and 33, each having a control electrode $G_1$, a screen S, a secondary-electron-emissive anode and a secondary-electron-collector electrode are substituted for the bidirectional electronic switch 3. Orbital beam tubes of this type are described in an article by H. M. Wagner and W. R. Ferris in the Proceedings of the Institute of Radio Engineers for November 1941, at pages 598 to 602. Screen voltage for the screen electrodes S is provided by an intermediate connection on a bias battery 18 which is connected between the cathode and the grounded terminal of the reactive load 13. Grid potential for the control electrodes $G_1$ of the orbital beam tubes 23 and 33 is provided by a second bias battery 27 connected between the cathodes of the tubes and one terminal of a votalge pickup winding 29 which is inductively coupled to the reactive load 13. The remaining terminal of the voltage pickup winding 29 is connected to the control electrodes $G_1$ of the tubes. Thus, keying voltages of the type shown in the solid line graph of Fig. 4 are applied to key the control electrodes $G_1$ of the two single orbital beam tubes in the manner described heretofore by reference to the circuit of Fig. 2.

The circuit also may be employed to provide high unidirectional operating voltages for external circuits. A second voltage pickup winding 31, inductively coupled to the reactive load 13, and having suitable voltage step-up characteristics, is connected, through a rectifier tube 35 and a conventional low-pass filter 37, to direct current output terminals 39, 41 which may be connected to any desired load 43. Thus, rectified and filtered unidirectional voltage may be applied to the load 43 simultaneously with the application of sawtooth deflecting currents to the inductive yoke 13.

A current meter 45 serially connected between the ungrounded terminal of the storage capacitor 9 and the anode and collector electrodes of the orbital beam tubes shows that the current load on the battery source 5 is reduced by a factor of 4 when both orbital beam tubes 23 and 33 are operated simultaneously, as compared with the operation of the circuit when either one of the tubes is operated alone. Thus, the bidirectional operation of the circuit materially improves the circuit efficiency as well as the linearity of the sawtooth deflecting currents applied to the reactive yoke 13.

The circuit of Figure 6 is similar to the circuit of Fig. 3 with the exception that applicant's novel bidirectional orbital beam tube is substituted for the pair of unidirectional orbital beam tubes 23, 33. The operation of the sawtooth voltage generator portion of the circuit is identical to that described heretofore by reference to the circuit of Figure 2, except that the control-grid voltage pulses are derived from a voltage pickup winding 29 coupled to the reactive yoke 13, in the same manner as described by reference to the circuit of Figure 3. The high voltage pickup winding 31 also coupled to the reactive yoke 13 provides rectified and filtered unidirectional potential for an external load 43 in the manner previously described.

Figure 7 shows a first embodiment of a bidirectional orbital beam electronic tube which may be employed in the circuits of Figures 2 and 6. An evacuated envelope 46 contains a centrally-disposed cathode K which is surrounded by successive concentrically disposed control electrodes $G_1$, semi-circular secondary-electron-collector electrodes $G_2$ and $G_3$ disposed on diametrically opposite sides of the cathode K, and diametrically disposed, semi-circular secondary-electron-emissive anodes $P_1$ and $P_2$. Internal or external connections may be provided between the anode $P_1$ and collector electrode $G_3$ and between the anode $P_2$ and the collector electrode $G_2$. The operation of the device is as described heretofore by reference to the circuit of Figure 2. One disadvantage of the structure disclosed is that foreign matter emitted by the cathode K directly impinges upon the anodes $P_1$ and $P_2$, thereby causing contamination of the secondary-electron-emissive coatings thereon. Also the collector electrodes $G_2$ and $G_3$ are subjected to undesirable primary-electron emission.

The structure illustrated in Figure 8 is superior to that shown in Figure 7 since primary electrons, emitted by the cathode K and controlled by the surrounding control electrode $G_1$, traverse orbital paths between the cathode and the anodes $P_1$ and $P_2$ due to the lens action of electron deflecting means comprising a pair of reflector electrodes 47, 49, which are biased negatively with respect to the cathode potential. Primary electrons traversing the orbital paths to the two secondary-electron-emissive anodes $P_1$ and $P_2$ do not impinge upon the collector electrodes $G_2$ and $G_3$ located adjacent to the anodes $P_1$ and $P_2$, respectively.

Also foreign matter emitted by the cathode is shielded from the anodes by means of the reflector electrode 47 interposed therebetween. Secondary electrons emitted by the anodes $P_1$ and $P_2$, in response to primary electrons impinging thereon, are collected by the adjacently disposed collector electrodes $G_2$ and $G_3$, respectively. Thus, the dual orbital paths provided by the unique reflector electrode construction shown in Figure 8 provide an exceedingly efficient and stable bidirectional electronic device when the tube is employed in circuits such as those shown in Figures 2 and 6.

A third type of tube construction illustrated in Fig. 9 includes a centrally disposed cathode surrounded by a control grid $G_1$ having electron deflecting or shielding portions 51 and 53 for preventing direct emission from the cathode to the flat, edgewise-disposed anodes $P_1$ and $P_2$. A pair of flat reflector electrodes $R_1$ and $R_2$, disposed parallel to and on opposite sides of the anodes $P_1$ and $P_2$, cause the primary electrons emitted by the cathode K to traverse cycloidal paths to the secondary-electron-emissive anodes $P_1$ and $P_2$, both of which emit secondary electrons from both side faces. The secondary electrons emitted by the anodes $P_1$ and $P_2$ are collected by the collector electrodes $G_2$ and $G_3$, respectively adjacent thereto, while the primary electron emission is effectively shielded from the collector electrodes by the cycloidal electron paths provided by the reflector electrodes. Appropriate operating potential polarities are indicated on the anode, collector, and reflector electrodes.

Thus, the invention described comprises several embodiments of novel sawtooth generator circuits including provisions for obtaining high unilateral operating potential for external circuits. Also three proposed types of bidirectional electronic switching tubes are disclosed and the operation thereof is explained by reference to their use in the disclosed circuits.

I claim as my invention:

1. A selectively bidirectional thermionic tube comprising an envelope enclosing at least a cathode, a control electrode, a pair of secondary-electron-emissive anodes and a pair of secondary-electron-collector electrodes, each of said collector electrodes being responsive to secondary electrons derived substantially only from an adjacent one of said anodes, a direct connection from one of said anodes to the one of said collectors adjacent to the other of said anodes, and a direct connection from the other of said anodes to the other of said collectors adjacent said one of said anodes.

2. A selectively bidirectional thermionic tube comprising an envelope enclosing at least a cathode, a control electrode, a pair of secondary-electron-emissive anodes and a pair of secondary-electron-collector electrodes, each of said collector electrodes being responsive to secondary electrons derived substantially only from an adjacent one of said anodes, means connecting one of said anodes to the one of said collectors adjacent to the other of said anodes, means connecting the other of said anodes to the other of said collectors adjacent said one of said anodes, and electron deflecting means interposed on the axes between said cathode and said anodes to shield said anodes from direct contamination by volatile matter emitted by said cathode.

3. Apparatus as described in claim 2 wherein said collector electrodes are shielded by said electron deflecting means from primary electrons passing from said cathode to said anodes.

4. A bidirectional thermionic tube comprising an envelope enclosing at least a cathode, a control electrode, a pair of secondary-electron-emissive anodes and a pair of secondary-electron-collector electrodes, each of said collector electrodes being responsive to secondary electrons derived substantially only from an adjacent one of said anodes, terminal means for connecting one of said anodes to the one of said collectors adjacent to the other of said anodes, terminal means for connecting the other of said anodes to the other of said collectors adjacent said one of said anodes, and electron deflecting means interposed on the axes between said cathode and said anodes to shield said anodes from direct contamination by volatile matter emitted by said cathode.

5. A bidirectional thermionic tube comprising an envelope enclosing at least a cathode, a control electrode, a pair of hemi-cylindrical secondary-electron-emissive anodes and a pair of hemi-cylindrical secondary-electron-collector screen electrodes, each of said collector electrodes being responsive to secondary electrons derived substantially only from an adjacent one of said anodes, said cathod, control electrode, collector electrodes and anodes being concentrically disposed in the order named and concentric ones of said pairs of said collector electrodes and anodes being disposed on diametrically opposite sides of said cathode.

6. Apparatus as described in claim 5 wherein each of said collector electrodes is connected to the diametrically oppositely disposed one of said anodes.

7. Apparatus as described in claim 5 wherein each of said collector electrodes is connected within said envelope to the diametrically oppositely disposed one of said anodes.

8. A bidirectional thermionic tube comprising an envelope enclosing at least a cathode, a control electrode surrounding said cathode, a pair of secondary-electron-emissive anodes and a pair of secondary-electron-collector electrodes, each of said collector electrodes being responsive to secondary electrons derived substantially only from an adjacent one of said anodes, means connecting one of said anodes to the one of said collectors adjacent to the other of said anodes, means connecting the other of said anodes to the other of said collectors adjacent said one of said anodes, dual arcuate electron deflecting means providing curved electron paths between said cathode and said anodes to shield said anodes from direct contamination by volatile matter emitted by said cathode, said collector electrodes being disposed outside the paths of said deflected primary electrons emitted by said cathode.

9. A bidirectional thermionic tube comprising an envelope enclosing at least a cathode, a control electrode surrounding said cathode, a pair of secondary-electron-emissive anodes disposed in a common plane passing through said cathode and a pair of secondary-electron-collector electrodes, each of said collector electrodes being responsive to secondary electrons derived substantially only from an adjacent one of said anodes, means connecting one of said anodes to the one of said collectors adjacent to the other of said anodes, means connecting the other of said anodes to the other of said collectors adjacent said one of said anodes, and a pair of flat reflector means disposed on diametrically opposite sides of said cathode and parallel with said anodes for providing separate cycloidal electron paths between said cathode and said anodes for shielding said anodes from direct contamination by volatile matter emitted by said cathode, said collector electrodes being disposed outside the paths of said deflected primary electrons emitted by said cathode.

10. A bidirectional thermionic tube comprising an envelope enclosing at least a cathode, a control electrode surrounding said cathode, a pair of secondary-electron-emissive anodes, a pair of secondary-electron-collector electrodes, each of said collector electrodes being responsive to secondary electrons derived substantially only from an adjacent one of said anodes, means connecting one of said anodes to the one of said collectors adjacent to the other of said anodes, means connecting the other of said anodes to the other of said collectors adjacent said one of said anodes, and a pair of flat reflector means disposed on diametrically opposite sides of said cathode for providing separate cycloidal electron paths between said cathode and said anodes for shielding said anodes from direct contamination by volatile matter emitted by said cathode, said collector electrodes being disposed outside the paths of said deflected primary electrons emitted by said cathode.

GEORGE C. SZIKLAI.

REFERENCES CITED

The following references are of record in the file of this patent:

UNITED STATES PATENTS

| Number | Name | Date |
|---|---|---|
| 1,704,155 | Thomas | Mar. 5, 1929 |
| 2,146,607 | Van Overbeek | Feb. 7, 1939 |
| 2,151,783 | Lopp et al. | Mar. 28, 1939 |
| 2,164,892 | Banks | July 4, 1939 |
| 2,173,267 | Strutt et al. | Sept. 19, 1939 |
| 2,305,646 | Thomas | Dec. 22, 1942 |
| 2,402,188 | Skellett | June 18, 1946 |